United States Patent [19]

Komatsu et al.

[11] Patent Number: 4,807,159
[45] Date of Patent: Feb. 21, 1989

[54] APPARATUS AND METHOD FOR CONTROLLING IRRADIATION OF AN ELECTRON BEAM AT A FIXED POSITION IN AN ELECTRON BEAM TESTER SYSTEM

[75] Inventors: Fumio Komatsu, Tokyo; Motosuke Miyoshi, Fujisawa; Katsuya Okumura, Yokohama, all of Japan

[73] Assignee: Kabushiki Kaisha Toshiba, Kawasaki, Japan

[21] Appl. No.: 897,429

[22] Filed: Aug. 18, 1986

[30] Foreign Application Priority Data

Aug. 19, 1985 [JP] Japan ............................ 60-181381

[51] Int. Cl.$^4$ ............... G01N 23/00; G21K 1/08; G01K 25/00
[52] U.S. Cl. .................. 364/524; 364/571.02; 250/311; 250/396 R; 324/158 R
[58] Field of Search ............... 364/524, 525, 550, 551, 364/571; 250/309–311, 396 R, 397; 324/158 R

[56] References Cited

U.S. PATENT DOCUMENTS

| | | | |
|---|---|---|---|
| 4,199,681 | 4/1980 | Namae | 250/310 X |
| 4,392,054 | 7/1983 | Sato et al. | 250/310 X |
| 4,396,901 | 8/1983 | Saitou | 364/571 X |
| 4,420,691 | 12/1983 | Zasio | 250/492.1 X |
| 4,567,369 | 1/1986 | Smith et al. | 250/311 X |
| 4,586,141 | 4/1986 | Yasuda et al. | 250/396 R X |
| 4,618,766 | 10/1986 | van der Mast et al. | 250/311 |
| 4,678,988 | 7/1987 | Brust | 324/158 R |
| 4,680,469 | 7/1987 | Nomura et al. | 250/311 |
| 4,689,555 | 8/1987 | Brust et al. | 324/158 R |
| 4,695,725 | 9/1987 | Mori et al. | 250/397 X |
| 4,698,503 | 10/1987 | Nomura et al. | 250/311 |

FOREIGN PATENT DOCUMENTS

| | | |
|---|---|---|
| 0081295 | 6/1983 | European Pat. Off. |
| 105902 | 5/1974 | Fed. Rep. of Germany . |
| 2805673 | 2/1977 | Fed. Rep. of Germany . |

OTHER PUBLICATIONS

DE Stafeno, "Voltage Comparator System for Contactless Microcircuit Testing", IBM Techn. Discl. Bull., vol. 17, No. 10, Mar. 1975, pp. 2871-2873.

Kuji, N., "A Fully-Automated Electron Beam Test System for VSLI Circuits", IEEE Design and Test, Oct. 1985, pp. 74–78.

T. J. Hsu, "Digital Adaptive Matched Filter for Fiducial Mark Registration," Hewlett-Packard Journal, pp. 34–36, May 1981.

Primary Examiner—Parshotam S. Lall
Assistant Examiner—Joseph L. Dixon
Attorney, Agent, or Firm—Finnegan, Henderson, Farabow, Garrett, & Dunner

[57] ABSTRACT

Before detecting the surface state of specific patterns a sample by means of an electron beam tester system, patterns formed in a specified surface area of the sample, are detected by deflecting an electron beam by a deflection coil. Data representing current supplied to the deflection coil, data representing the position of the sample during the pattern-detecting operation, and image signals representing the patterns found in the specified surface area, are stored in a memory. While the specific patterns of a sample are being detected, the electron beam is used to perform a second pattern-detecting operation. Data representing current supplied to the deflection coil during the second pattern-detecting operation, such data representing the position of the sample, and image signals provided by the second pattern-detecting operation representing the patterns formed in the specified surface area, are compared with those data items already stored in the memory. From the difference between the compared two sets of data items, any drift in the electron beam is calculated. In accordance with the drift thus calculated, the deflection coil is energized to deflect the electron beam such that the beam is applied onto the desired portion of the sample.

9 Claims, 6 Drawing Sheets

APPARATUS AND METHOD FOR CONTROLLING IRRADIATION OF AN ELECTRON BEAM AT A FIXED POSITION IN AN ELECTRON BEAM TESTER SYSTEM

BACKGROUND OF THE INVENTION

The present invention relates to an apparatus and method for controlling the irradiation of an electron beam at a fixed position in an electron beam tester system in which an electron beam is irradiated onto the surface of a sample to be measured such as, e.g., a large scale integrated circuit (LSI) and thereby measuring the state (potential) of the surface and, more particularly, to an apparatus and method for correcting the deviation of the irradiating position due to the drift of the electron beam which is caused during measurement.

In a tester system using an electron beam such as a scanning electron microscope apparatus (SEM), or stroboscopic scanning electron microscope apparatus, or the like, an electron beam is irradiated onto the surface of a sample to be measured and the resultant secondary electron or reflected electron which will be obtained in accordance with the state (material, potential, and the like) of the surface of the sample is detected, thereby displaying the state of the surface of the sample (in the case where the sample is an LSI, circuit pattern, potential distribution, and the like) on an image display device and observing it.

Hitherto, in the case of irradiating an electron beam onto a specific pattern formed on the surface of the LSI using such an electron beam tester system as mentioned above and thereby measuring a change in voltage of the specific pattern, the specific pattern is searched from among the patterns of the LSI and the electron beam is irradiated to the central position of this pattern. Due to this, the risk that the irradiating position of the electron beam deviates from the specific pattern due to drift of the electron beam during measurement of the sample to be measured is desired to be reduced as much as possible. However, when the electron beam drifts and deviates from the pattern, the irradiating position of the electron beam is reset and the measurement is again performed. The drift of the electron beam is mainly caused due to the following factors (1) to (4).

(1) The primary electron beam is bent by the electrical charge caused by the dust and the like deposited on the inner periphery of the electron-optical-column of the electron beam tester system.

(2) The primary electron beam is bent by the electrical charge accumulated in the surface of the sample as the electron beam is applied onto the sample.

(3) The sample to be measured expands due to the heat which is generated while the sample being measured is electrically made operative, so that the positional relations among the sample to be measured, package, performance board, and the stage (XY stage) on which the sample is put upon deviate.

(4) The beam alignment of the electron gun deviates due to a change in temperature of the electron gun during the measurement.

In the case where the dimension of the pattern onto which the electron beam will be irradiated is sufficiently large (e.g., 4 to 6 $\mu$m), even if a slight drift of the electron beam occurs, the electron beam will hardly deviate from the pattern, so that no problem will occur. However, when the pattern dimension is 2 $\mu$m or less, even if the electron beam is first set so as to irradiate the central position of the pattern as well, the possibility will increase that the irradiating position will be deviated from the pattern due to a drift of the electron beam during the measurement so much that the measurement cannot be performed. Therefore, the reliability of the electron beam tester system deteriorates. In addition, the necessity of remeasurement causes a reduction in the usability of the expensive electron beam tester system and a decrease in the measurement efficiency. Further, in this remeasurement, the original (measured) specific pattern needs to be determined once more. If this pattern is characteristic, it can be relatively easily searched by observing the patterns which are displayed on the image display device. However, in the case of a pattern image which is not characteristic (e.g., fine repetitive pattern), it is difficult to search for it. This also causes the reduction of the use efficiency of the electron beam tester system.

SUMMARY OF THE INVENTION

It is therefore an object of the present invention to provide apparatus and method for controlling the irradiation of an electron beam at a fixed position in which when the state of a specific pattern (at a specific position) of the surface of a sample to be measured is measured by an electron beam tester system, the electron beam can be corrected during the measurement such that the specific pattern can be accurately irradiated by the electron beam, thereby enabling the reliability and efficiency in measurement to be improved.

According to one embodiment of the present invention, there is provided an apparatus for controlling the irradiation of an electron beam at a fixed position in an electron beam tester system comprising: an electron gun for generating an electron beam; a deflecting coil for deflecting the electron beam generated from the electron gun; a sample to be measured onto which the electron beam generated from the electron gun is irradiated; a scintillator for detecting the secondary electron generated due to the irradiation of the electron beam onto the sample to be measured; a current/voltage converter for converting an output current of the scintillator to an voltage corresponding to this current; an image display device to which an output of the current/voltage converter is supplied and which displays an image obtained due to the irradiation of the electron beam onto the sample to be measured; binarizing means for binarizing the output voltage of the current/voltage converter; reference pattern data memory means for irradiating the electron beam from the electron gun onto a scanning area including a specific pattern selected from a sample measured prior to measuring the sample to be actually measured, for detecting the secondary electron obtained due to the irradiation of the electron beam by the scintillator, and for storing a binarized signal, as reference pattern data, which is obtained by the binarizing means by binarizing the image signal derived by converting the output current of the scintillator to the voltage by the current/voltage converter; analog/digital converting means for converting an analog deflection current which is supplied to the deflecting coil to digital data; reference deflection current memory means for storing a value of the deflection current which was converted to the digital data by the analog/digital converting means when the reference pattern data is obtained; comparison pattern data memory means for interrupting the measurement of the sample to be measured, for deflecting the electron beam by supplying the deflection current stored in the reference deflection current memory means to the deflecting coil, detecting the secondary electron derived due to the irradiation of the electron beam by the scintillator, and for storing a binarized signal, as comparison pattern data, which is obtained by the binarizing means by binarizing the image signal derived by converting the output current of the scintillator to the voltage by the current/voltage converter; comparison deflection current memory means for storing a deflection current derived by converting the analog deflection current to the deflecting coil when the comparison pattern data is obtained to the digital data; exclusive OR means for obtaining an exclusive OR between the reference pattern data stored in the reference pattern data memory means and the comparison pattern data stored in the comparison pattern data memory means; deviation amount calculating means for calculating deviation amount in X and Y directions of the comparison pattern data on the basis of the exclusive OR data obtained by the exclusive OR means and the reference pattern data; and digital-/analog converting means for converting the digital comparison pattern data which is output from the deviation amount calculating means to the deviation amounts and for supplying this deviation amounts as drift correction data to the deflecting coil.

With such a constitution, when the state of a specific pattern (at a specific position) of the surface of the sample to be measured is measured by the electron beam tester system, the electron beam can be corrected during the measurement so that the electron beam can accurately irradiate the specific pattern, so that the reliability and efficiency in measurement can be improved.

DETAILED DESCRIPTION OF THE PREFERRED EMBODIMENTS

Figure 1A:
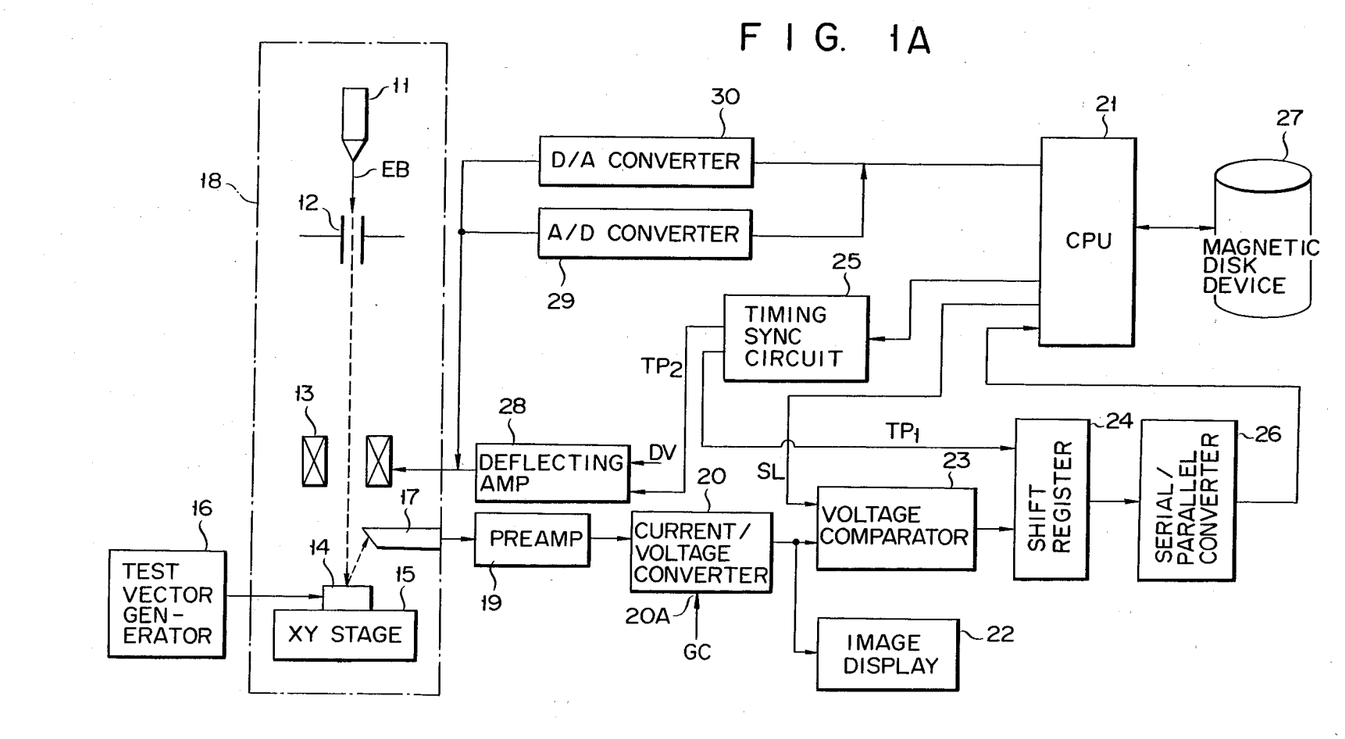
FIG. 1A is a block diagram showing an apparatus for controlling the irradiation of an electron beam at a fixed position according to one embodiment of the present invention.

FIG. 1A shows an electron beam tester system according to an embodiment of the present invention. An electron beam EB emitted from an electron gun 11 is irradiated onto the surface of a sample (e.g., LSI) 14 to be measured through a blanking electrode 12 and a deflecting coil 13. Blanking electrode 12 controls blanking of electron beam EB generated from electron gun 11, thereby producing a pulse-form electron beam. Deflecting coil 13 deflects electron beam EB generated from electron gun 11, thereby allowing electron beam EB to scan on sample 14 to be measured. Sample 14 is put on an XY stage 15. By moving XY stage 15 in the X and Y directions, the irradiating position of electron beam EB can be controlled. In the case of measuring the potential distribution of the LSI, a test vector signal and an operating power source voltage are supplied from a test vector generator 16 to sample 14, so that this sample is made operative. By irradiating electron beam EB onto sample 14, the secondary electron generated from the surface of sample 14 (or, reflected electron which was reflected by the surface of sample 14) is detected by a scintillator 17. Electron gun 11, blanking electrode 12, deflecting coil 13, sample 14 to be measured, XY stage 15, and scintillator 17 are respectively arranged in an electron-optical-column 18. The current of the secondary electron detected by scintillator 17 is amplified by a preamplifier 19. An output current of preamplifier 19 is supplied to a current/voltage converter 20. Converter 20 converts the output current which is output from preamplifier 19 to the voltage corresponding to this current. Converter 20 has a gain control terminal 20A and the converting sensitivity of converter 20 is controlled by a gain control signal GC which is output from a CPU 21. The output voltage of converter 20 is supplied to an image display device 22 for displaying an image and to one input terminal of a voltage comparator 23, respectively. A slice level SL is supplied from CPU 21 to the other input terminal of voltage comparator 23. Comparator 23 functions as a binarizing circuit to binarize the output of converter 20 using a potential of slice level signal SL as a reference. The binarized output of comparator 23 is supplied to a shift register 24 of the serial input type. Shift register 24 temporarily stores the binarized data which is output from comparator 23. Shift register 24 sequentially shifts the binarized data supplied from voltage comparator 23 on the basis of a timing pulse signal $TP_1$ which is generated from a timing synchronous circuit 25. Synchronous circuit 25 generates timing pulse signals $TP_1$ and $TP_2$ under control of CPU 21. An output of shift register 24 is supplied to a serial/parallel converter 26. Converter 26 converts a serial signal which is output from shift register 24 into a parallel signal and supplies to CPU 21. The parallel data supplied from converter 26 to CPU 21 is then transmitted and stored into a magnetic disk device 27 serving as an external memory device. The storing operation in this case is controlled by CPU 21 (for example, by setting an address).

Figure 1B:
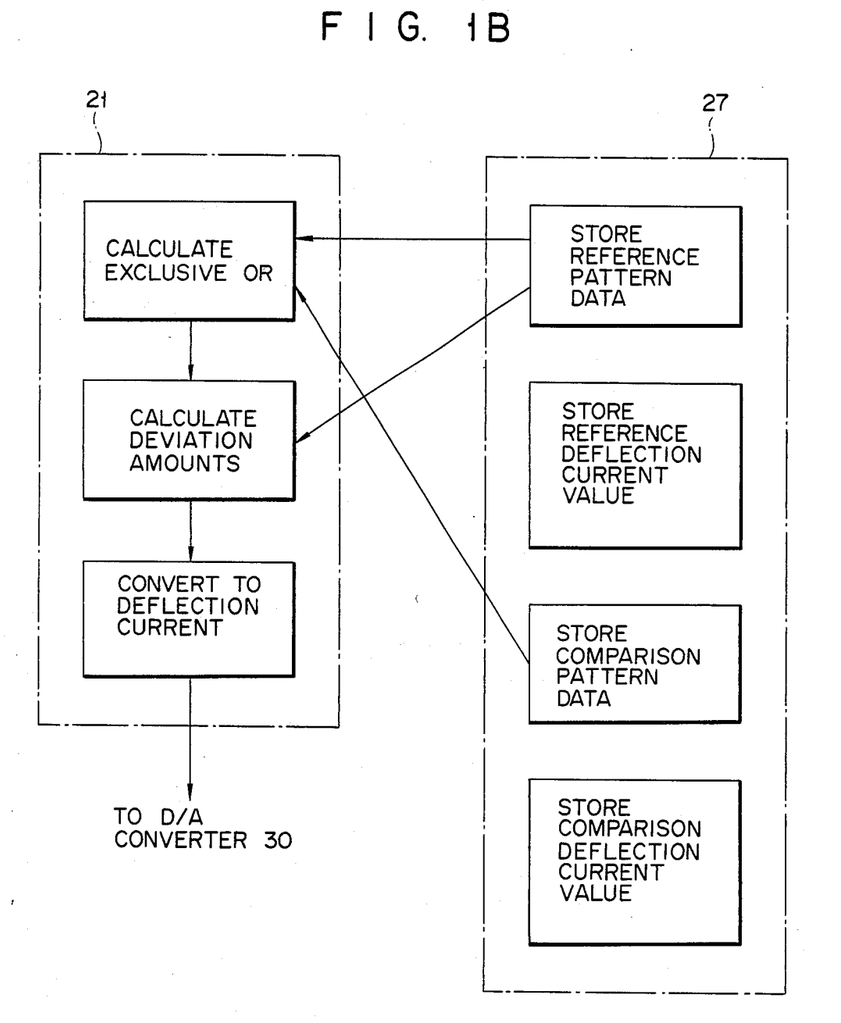
FIG. 1B is a block diagram showing the functions of a CPU and a magnetic disk device shown in FIG. 1A.

An output (timing pulse signal $TP_2$) of timing synchronous circuit 25 and data DV at a deflecting voltage level which is output from CPU 21 are supplied to a deflecting amplifier 28. Deflecting amplifier 28 supplies a deflection current to deflecting coil 13. The current flowing through deflecting coil 13 is supplied to an analog/digital converter 29 and sampled for every predetermined time interval. The current converted to the digital data by converter 29 is stored into magnetic disk device 27 through CPU 21. The digital signal as drift correction data which is generated from CPU 21 is delivered to a digital/analog converter 30. The drift correction data converted to the analog data by converter 30 is supplied to deflecting coil 13. Although not shown, electron gun 11, blanking electrode 12, XY stage 15, and test vector generator 16 are also controlled by CPU 21, respectively. In addition, CPU 21 and magnetic disk device 27 have the functions as shown in FIG. 1B, respectively.

Figure 2A:
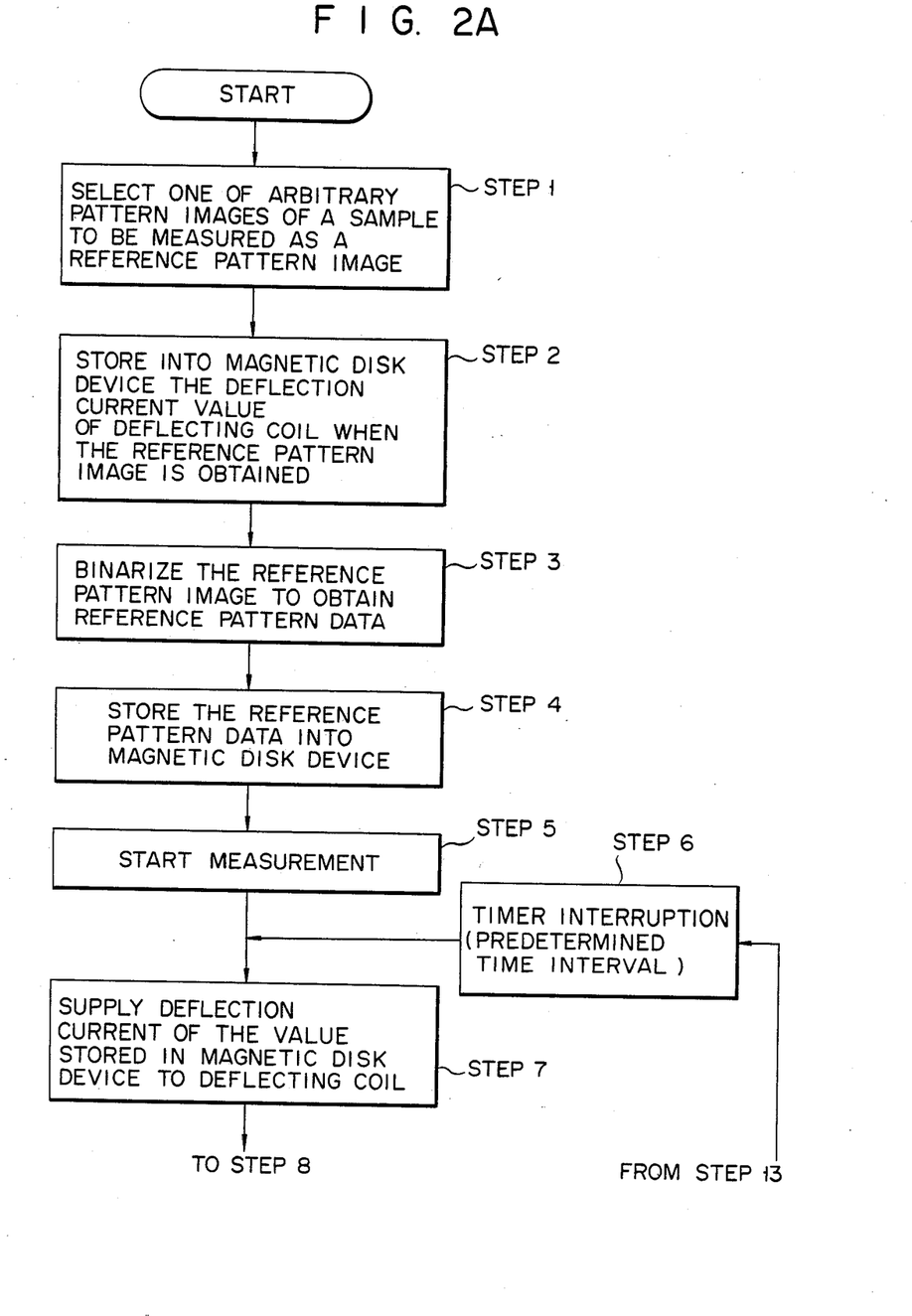
FIGS. 2A and 2B are flowcharts showing a method of controlling the irradiation of an electron beam at a fixed position according to one embodiment of the invention.
Figure 2B:
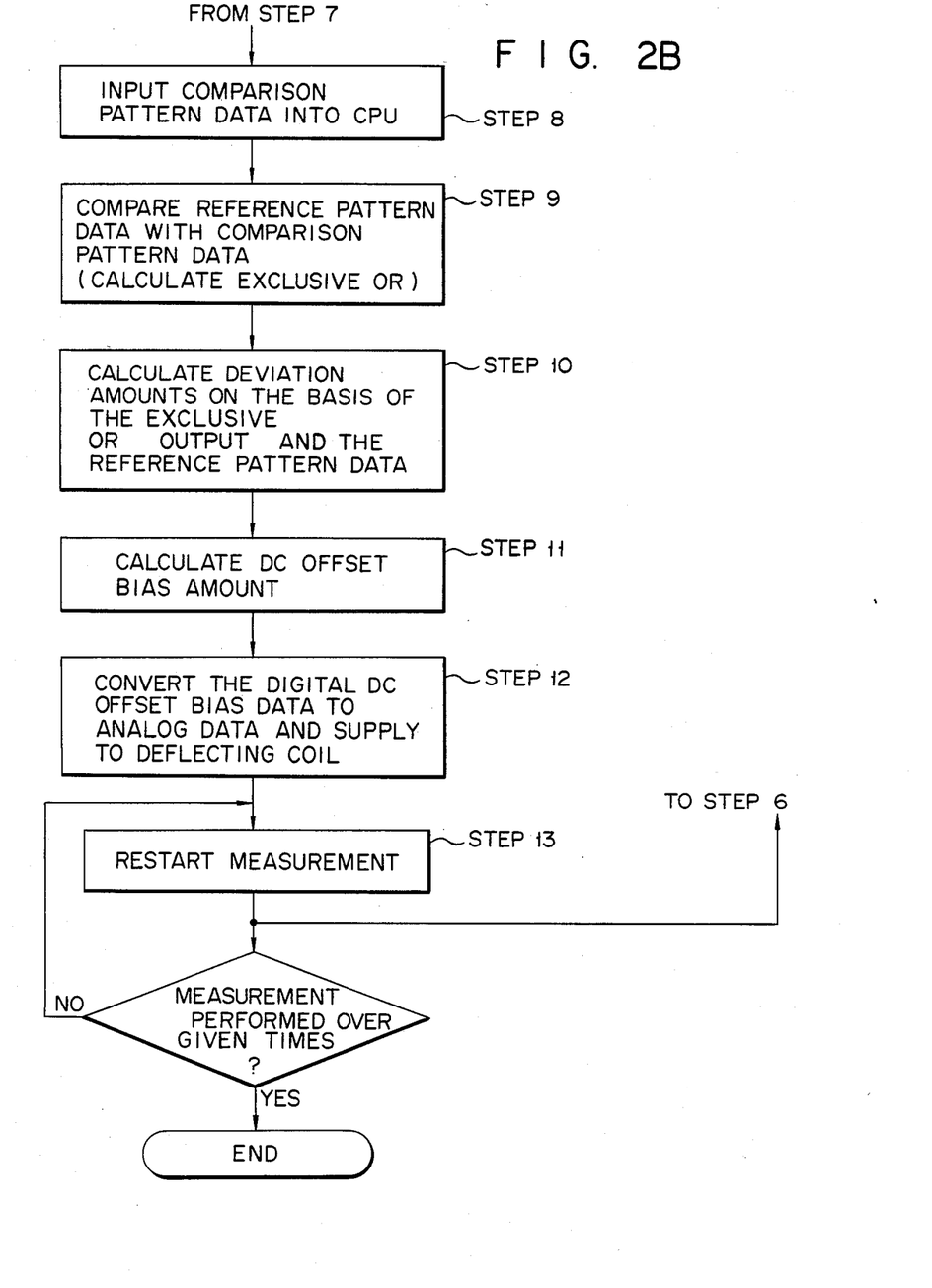
Figure 3:
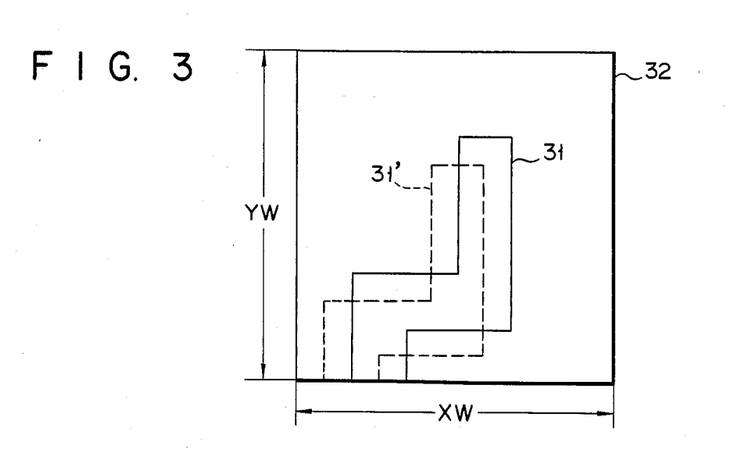
FIG. 3 is a diagram showing a pattern detection image which is obtained by use of the apparatus shown in FIG. 1.
Figure 4:
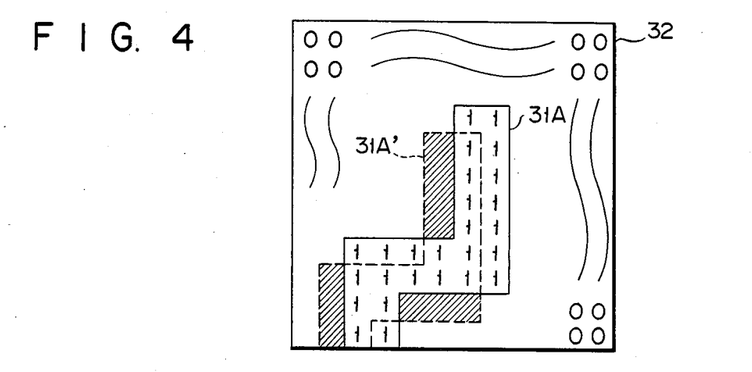
FIG. 4 is a diagram showing a binarized data pattern which is obtained by binarizing the pattern detection image in FIG. 3.
Figure 5:
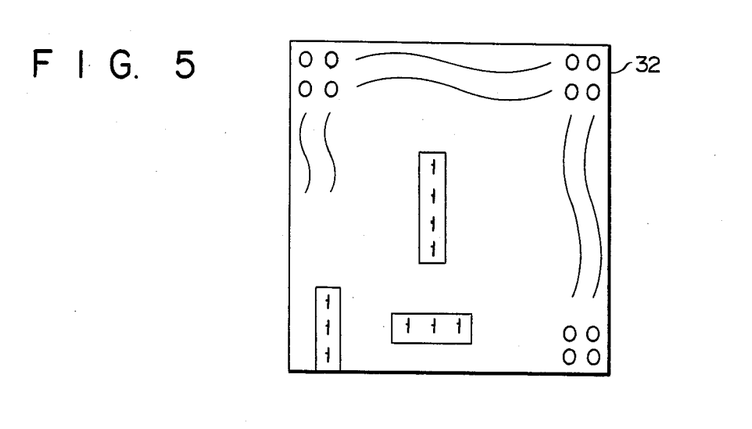
FIG. 5 is a diagram showing the pattern detection data which is obtained by use of the apparatus shown in FIG. 1.

The operation of the apparatus shown in FIG. 1A and a method of controlling the irradiation of an electron beam at a fixed position will now be described with reference to FIGS. 2 to 5. FIG. 2 is a flowchart showing the method of controlling the irradiation of an electron beam at a fixed position. FIG. 3 is a diagram showing a pattern detection image which is obtained from image display device 22 by use of the apparatus of FIG. 1. FIG. 4 is a diagram showing a binarized data pattern which is obtained by binarizing the pattern detection image of FIG. 3 by voltage comparator 23. FIG. 5 is a diagram showing a pattern detection data which is derived by use of the apparatus of FIG. 1.

Prior to starting the measurement, electron beam EB is first emitted from electron gun 11 and data DV of a deflecting voltage level is given to deflecting amplifier 28, thereby deflecting electron beam EB. Thus, the surface of sample 14 is scanned by electron beam EB. The secondary electrons generated from the surface of sample 14 due to the irradiation of electron beam EB are detected by scintillator 17. An output current of scintillator 17 is supplied to preamplifier 19 and amplified. An output current of preamplifier 19 is converted to the voltage corresponding to the current by current/voltage converter 20 and this voltage signal is supplied to image display device 22. The image of the area scanned by the electron beam is displayed on display device 22.

Next, the operator changes data DV of the deflecting voltage level which is supplied to deflecting amplifier 28 or drives XY stage while observing the image on display device 22, thereby selecting one of the arbitrary pattern images displayed on display device 22 as a reference pattern image (step 1).

It is now assumed that, for example, an image is displayed on display device 22 as shown in FIG. 3. In this case, a scanning area 32 of sample 14 to be measured including a selected reference pattern image 31 is scanned by electron beam EB. An analog current of deflecting coil 13 which is output from deflecting amplifier 28 when reference pattern image 31 is scanned by electron beam EB is converted to a digital data by analog/digital converter 29 and this digital data is stored as scanning area data into magnetic disk device 27 through CPU 21 (step 2). At the same time, a signal (image signal) which is derived through scintillator 17, preamplifier 19, and converter 20 upon scanning of scanning area 32 is supplied to voltage comparator 23. Slice level signal SL serving as a reference is given from CPU 21 to comparator 23 in order to obtain the binarized reference pattern data. The image signal of scanning area 32 is binarized by comparator 23, so that reference pattern data as shown in FIG. 4 is obtained (step 3). This binarized reference pattern data is supplied to shift register 24. The reference pattern data supplied to shift register 24 is sequentially shifted on the basis of timing pulse signal $TP_1$ which is generated from timing synchronous circuit 25 and supplied to serial/parallel converter 26. This serial reference pattern data supplied to converter 26 is converted to the parallel signal and input to CPU 21. The parallel binarized reference pattern data taken in CPU 21 is stored into magnetic disk device 27 (step 4). The initialization is completed in steps 1 to 4.

Thereafter, the potentials of the various portions of a reference pattern image 31 are measured. More specifically, first, the deflection current is adjusted, thereby applying electron beam EB to a prescribed node on reference pattern image 31. When the measurement is started (step 5), the pulse-like electron beam derived by blanking-controlling electron beam EB by blanking electrode 12 at a predetermined timing under control of CPU 21 is irradiated onto sample 14 and a change in voltage on the prescribed node on reference pattern image 31 is measured. In this case, the sample (LSI) to be measured is made operative by applying a test vector signal and an operating power source voltage from test vector generator 16. In the case where it takes a long time for this measurement, interruption of the timer is executed by CPU 21 during the measurement so as to correct the drift of electron beam EB (step 6), thereby allowing the processes, which will be explained hereinafter, to be executed at a predetermined time interval. Namely, the irradiation of electron beam EB to the prescribed node on reference pattern image 31 is interrupted and data DV of the deflecting voltage level is taken out of magnetic disk device 27 to CPU 21 and supplied from CPU 21 to deflecting amplifier 28 so that electron beam EB can be irradiated onto the reference pattern image 31 which has previously stored into magnetic disk device 27 before the measurement. The deflection current which is output from deflecting amplifier 28 is supplied to deflecting coil 13 (step 7). Thus, scanning area 32 of sample 14 shown in FIG. 3 is again scanned by electron beam EB. The output of current/voltage converter 20 which is derived through scintillator 17 and preamplifier 19 upon scanning of the electron beam is binarized by voltage comparator 23. This binarized signal is input to CPU 21 through shift register 24 and serial/parallel converter 26 (step 8). In this case, deflecting amplifier 28 and shift register 24 are synchronized by timing synchronous circuit 25. Due to this, the deflection start position can accurately correspond to the start bit of the binarized data. In this case, assuming that the scanning widths (indicated at XW and YW in FIG. 3) of electron beam EB are set to 25.6 μm and the capacity of shift register 24 is 256 bits, for example, the resolution per bit of the binarized data will become 0.1 μm. These scanning widths XW and YW of electron beam EB may be set to a proper value in accordance with the width of pattern to be measured.

The binarized data of the scanning area obtained during the measurement as described above and the binarized data of scanning area 32 which has previously stored into magnetic disk device 27 before the measurement are compared and processed by CPU 21 (step 9). This comparing process may be executed by calculating the exclusive OR of both data by CPU 21, for example. As shown by a broken line 31' in FIG. 3, in the case where the pattern image derived during the measurement is deviated from the reference pattern image (indicated by a solid line 31) which has previously stored, the pattern of the binarized data is deviated as indicated by a broken line 31A' as compared with the pattern of the data stored in magnetic disk device 27 indicated by solid line 31A in FIG. 4. Therefore, the result of the comparison of the binarized data having such a pattern as shown in FIG. 5 corresponding to an amount of deviation of the patterns between both data is obtained (step 10). The resolution per bit of the data of the result of the comparison has previously been known from the relation between the scanning widths XW and YW of electron beam EB and the number of bits of shift register 24 as mentioned before and corresponds to the amounts of drifts in the X and Y directions of electron beam EB on sample 14 which were caused during the measurement. Therefore, the drift amounts of electron beam EB can be calculated from the deviation amounts of those two patterns.

Next, to correct the drift amounts, DC offset bias amounts are calculated by CPU 21 in consideration of the deflecting sensitivity of deflecting coil 13 (step 11). The DC offset bias amounts can be calculated in the following manner. Namely, assuming that the deviation amounts of two patterns are x(dot) and y(dot), the drift amounts ΔXW and ΔYW of the electron beam respectively become $$\Delta XW = \frac{\text{frame width}}{\text{magnification}} \times \frac{x}{\text{number of pixels in frame}} \ (\mu m)$$

$$\Delta YW = \frac{\text{frame width}}{\text{magnification}} \times \frac{y}{\text{number of pixels in frame}} \ (\mu m)$$

The DC offset bias amounts ΔX and ΔY are $$\Delta X = \frac{\Delta XW}{\text{deflecting sensitivity}} \ (V)$$

$$\Delta Y = \frac{\Delta YW}{\text{deflecting sensitivity}} \ (V)$$

These DC offset bias amount data ΔX and ΔY are supplied to digital/analog converter 30 and these digital data are converted into the analog data. Analog DC offset bias amount data ΔX and ΔY which are output from converter 30 are supplied to deflecting coil 13, thereby correcting the deflection outputs in the X and Y directions (step 12). Due to this, the irradiating position of electron beam EB onto sample 14 is corrected. When the measurement is restarted (step 13), electron beam EB can be accurately irradiated at the position of specific pattern image 31 before the drift.

With such a constitution, when the state of the specific pattern image (at the specific position) of the surface of the sample to be measured is measured by the electron beam tester system, the electron beam can be corrected during the measurement so that the electron beam can be accurately irradiated onto the specific pattern image. Therefore, the reliability and efficiency in measurement can be improved.

Figure 6:
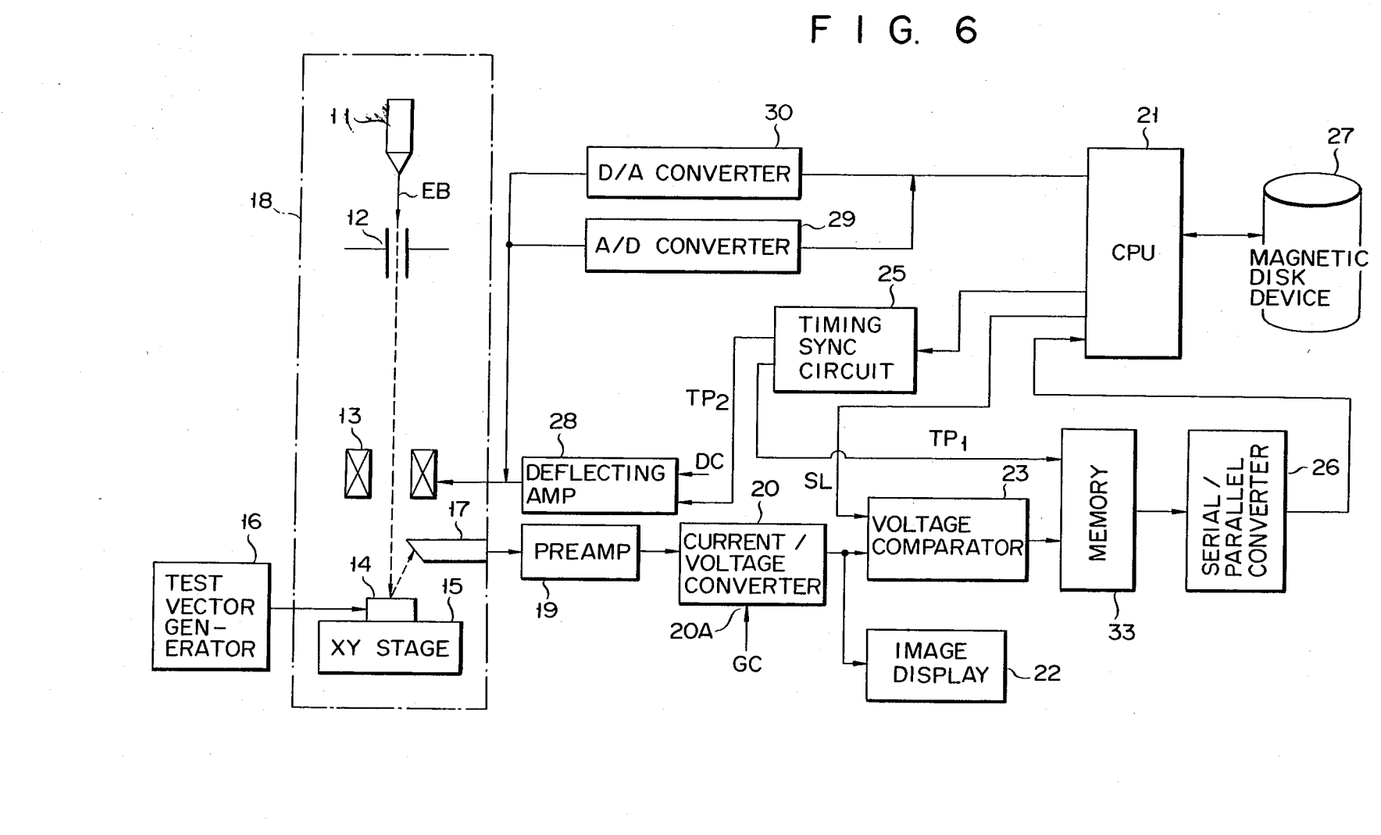
FIG. 6 is a block diagram showing an apparatus for controlling the irradiation of an electron beam at a fixed position according to another embodiment of the invention.

FIG. 6 shows an apparatus for controlling the irradiation of an electron beam at a fixed position according to another embodiment of the invention. In FIG. 6, the same parts and components as those shown in FIG. 1 are designated by the same reference numerals and their detailed descriptions are omitted. Namely, a memory 33 is provided in place of shift register 24 serving as temporary storing means in FIG. 1. The address in memory 33 is sequentially counted up by timing pulse signal TP1 which is output from timing synchronous circuit 25. With such an arrangement as well, it will be obvious that the same operation as that in the embodiment in FIG. 1 is executed and the same effect can be obtained.

What is claimed is:

1. An electron beam tester system having a beam control device for correcting a deviation from an irradiating position due to drift of the electron beam while measuring a sample, the system comprising:

an electron gun for generating an electron beam for irradiating the sample;

a deflecting coil for deflecting the electron beam generated from said electron gun;

a scintillator for detecting a secondary electron generated due to irradiation of the electron beam onto said sample;

a current/voltage converter for converting an output current of said scintillator to a voltage corresponding to said current;

an image display device to which an output of said current/voltage converter converter is supplied and which displays an image obtained due to the irradiation of the electron beam onto the sample;

binarizing means for binarizing the output voltage of the current/voltage converter;

reference pattern data memory means for irradiating the electron beam from said electron gun onto a scanning area of the sample according to a specific pattern that is on said sample to be measured prior to measuring the sample, for detecting the secondary electron derived by said scintillator during irradiation of the sample, and for storing a binarized signal as reference pattern data, the binarized signal being derived by said binarizing means by binarizing the image signal obtained by converting an output current of said scintillator to a voltage by said current/voltage converter;

analog/digital converting means for converting an analog deflection current, which is supplied to said deflecting coil, to digital data;

reference deflection current memory means for storing a value of said deflection current coverted to the digital data by said analog/digital converting means when said reference pattern data is obtained;

comparison pattern data memory means for interrupting the measurement of said sample to be measured, for deflecting the electron beam by supplying the deflection current stored in said reference deflection current memory means to said deflecting coil, for detecting the secondary electrons derived due to the irradiation of the electron beam by said scintillator, and for storing the binarized signal as comparison pattern data which is derived by said binarizing means by binarizing the image signal obtained by coverting the output current of the scintillator to the voltage by said current/voltage converter;

comparison deflection current memory means for storing the deflection current which is obtained by converting the analog deflection current to the deflecting coil when obtaining said comparison pattern data to the digital data;

exclusive OR means for obtaining an exclusive OR of the reference pattern data stored in said reference pattern data memory means and the comparison pattern data stored in said comparison pattern data memory means;

deviation amount calculating means for calculating deviation amounts in said comparison pattern data on the basis of the exclusive OR data derived by said exclusive OR means and said reference pattern data;

deflection current converting means for converting the deviation amounts calculated by said deviation amount calculating means for to deflection currents for said deflecting coil; and digital/analog converting means for converting the digital comparison pattern data which is output from said deflection current converting means to the analog data and for supplying said analog data as drift correction data to said deflecting coil.

2. An apparatus according to claim 1, wherein said reference pattern data memory means, said reference deflection current memory means, said comparison pattern data memory means, and said comparison deflection current memory means comprise a magnetic disk device.

3. An apparatus according to claim 1, wherein said exclusive OR means, said deviation amount calculating means, and said deflection exciting current converting means comprise a CPU.

4. An apparatus according to claim 1, wherein said binarizing means includes a voltage comparator.

5. An apparatus according to claim 1, further comprising a blanking electrode for controlling the electron beam which is generated from said electron gun to produce a pulse-form electron beam.

6. An apparatus according to claim 1, further comprising a preamplifier for amplifying a signal output from said scintillator and for supplying the amplified signal to said current/voltage converter.

7. An apparatus according to claim 1, further comprising a test vector generator for supplying a test vector signal and an operating power source voltage to said sample to be measured.

8. A method for correcting deviation of an irradiating position due to drift of an electron beam while measuring patterns on a sample by means of an electron beam tester system, said method comprising the steps of:
selecting any one of the patterns of the sample as a reference pattern;
storing a deflection current value, as a reference deflection current, of a deflecting coil when said reference pattern image is obtained;
binarizing an image signal of a scanning area including said selected reference pattern image and obtaining reference pattern data;
storing said reference pattern data;
starting a measurement of said sample to be measured;
interrupting the measurement of said sample to be measured;
supplying said stored reference deflection current to the deflecting coil;
binarizing the pattern image obtained due to the supply of said reference deflection current to the deflecting coil and obtaining comparison pattern data;
obtaining an exclusive OR of the binarized comparison, pattern data and the binarized reference pattern data;
comparing the exclusive OR obtained in the preceding step with the binarized reference pattern data to determine any difference between the two patterns which results from drift of said electron beam;
calculating a digital DC offset bias data for the deflecting coil based on the difference determined by said comparing step; and
converting said digital DC offset bias data to analog data and supplying the analog data to the deflecting coil.

9. A method according to claim 8, wherein the step of comparing said reference pattern data with said comparison pattern data comprises an exclusive OR between said reference pattern data and said comparison pattern data.

* * * * *